(12) United States Patent
Shon et al.

(10) Patent No.: US 11,100,960 B2
(45) Date of Patent: Aug. 24, 2021

(54) NOISE AMPLIFICATION CIRCUIT AND MEMORY DEVICE INCLUDING THE NOISE AMPLIFICATION CIRCUIT

(71) Applicant: SK hynix Inc., Icheon-si (KR)

(72) Inventors: Kwan Su Shon, Guri-si (KR); Dong Hyun Kim, Icheon-si (KR); Yo Han Jeong, Yongin-si (KR)

(73) Assignee: SK hynix Inc., Icheon-si (KR)

(*) Notice: Subject to any disclaimer, the term of this patent is extended or adjusted under 35 U.S.C. 154(b) by 0 days.

(21) Appl. No.: 16/733,881

(22) Filed: Jan. 3, 2020

(65) Prior Publication Data
US 2020/0388306 A1 Dec. 10, 2020

(30) Foreign Application Priority Data
Jun. 4, 2019 (KR) .................. 10-2019-0066070

(51) Int. Cl.
G11C 7/10 (2006.01)
G11C 5/14 (2006.01)
G11C 8/18 (2006.01)
G11C 8/10 (2006.01)

(52) U.S. Cl.
CPC ............ *G11C 5/147* (2013.01); *G11C 7/1057* (2013.01); *G11C 7/1084* (2013.01); *G11C 8/10* (2013.01); *G11C 8/18* (2013.01)

(58) Field of Classification Search
CPC ...... G11C 5/147; G11C 7/1057; G11C 7/1084; G11C 8/10; G11C 8/18
See application file for complete search history.

(56) References Cited

U.S. PATENT DOCUMENTS

| 6,809,576 B1 * | 10/2004 | Yamasaki | G05F 1/465 327/540 |
| 8,427,804 B2 * | 4/2013 | Matsumoto | H03F 3/2173 361/93.7 |
| 9,853,649 B2 | 12/2017 | Staszewski et al. | |
| 10,622,059 B2 * | 4/2020 | Onuki | H01L 29/792 |
| 2020/0111535 A1 * | 4/2020 | Han | G11C 16/3409 |

FOREIGN PATENT DOCUMENTS

| KR | 1020130106625 A | 9/2013 |
| KR | 101559501 B1 | 10/2015 |
| KR | 1020170056952 A | 5/2017 |
| KR | 101865929 B1 | 6/2018 |

* cited by examiner

*Primary Examiner* — Pho M Luu
(74) *Attorney, Agent, or Firm* — William Park & Associates Ltd.

(57) ABSTRACT

A data transfer circuit and a memory device including the data transfer circuit are provided. The data transfer circuit includes a first regulator provided with an external voltage to output a first internal voltage; a second regulator configured in a same manner as the first regulator and provided with the external voltage to output a second internal voltage; an amplifier configured for amplifying noise between the first internal voltage and the second internal voltage to output an amplification voltage; and a plurality of peripheral circuits performing by being provided with the first internal voltage.

20 Claims, 8 Drawing Sheets

NOISE AMPLIFICATION CIRCUIT AND MEMORY DEVICE INCLUDING THE NOISE AMPLIFICATION CIRCUIT

CROSS-REFERENCE TO RELATED APPLICATION

The present application claims priority under 35 U.S.C. § 119(a) to Korean patent application number 10-2019-0066070, filed on Jun. 4, 2019, in the Korean Intellectual Property Office, the entire disclosure of which is incorporated herein by reference.

BACKGROUND

1. Technical Field

Various embodiments of the present disclosure relate generally to a noise amplification circuit and a memory device including the noise amplification circuit.

2. Related Art

Memory devices may store, output, or erase data using an external voltage. The memory devices may include a memory cell array to store data, peripheral circuits to perform operations such as a program operation, a read operation, or an erase operation, and a control logic to control the peripheral circuits.

The peripheral circuits may generate voltages used for various operations and include various circuits to transfer addresses and data. Because the peripheral circuits operate with an external voltage, when a fluctuation occurs in the external voltage, jitter may occur during data transfer operation, and thus the reliability of the peripheral circuits may be reduced.

SUMMARY

According to an embodiment, a noise amplification circuit may include a first regulator provided with an external voltage to output a first internal voltage; a second regulator configured in a same manner as the first regulator and provided with the external voltage to output a second internal voltage; an amplifier configured for amplifying noise between the first internal voltage and the second internal voltage to output an amplification voltage; and a plurality of peripheral circuits performing by being provided with the first internal voltage.

According to an embodiment, a memory device may include a memory cell array configured for storing data, peripheral circuits configured to program data to the memory cell array, read stored data, or erase stored data, and a logic circuit configured for controlling the peripheral circuits, wherein the peripheral circuits comprise an input circuit switching an external voltage to first and second internal voltages and receiving data through data pads using the first and second internal voltages.

DETAILED DESCRIPTION

Advantages and features of the present disclosure and methods for achieving them will be made clear from embodiments described below with reference to the accompanying drawings. However, they may be embodied in different forms and should not be construed as limited to the embodiments set forth herein. Rather, these embodiments are provided so that this disclosure will be thorough and complete, and will fully convey the scope of the embodiments to those skilled in the art.

It will be understood that when an element is referred to as being "coupled" or "connected" to a certain element, it may be "directly coupled or connected" to the certain element or may be "indirectly coupled or connected" to the certain element, with intervening elements being present therebetween. In the specification, when an element is referred to as "comprising" or "including" a component, it does not exclude other components but may further include other components unless a description to the contrary is specifically pointed out in context.

Various embodiments may be directed to a noise amplification circuit capable of compensating jitter when data is transferred and a memory device including the noise amplification circuit.

Figure 1:
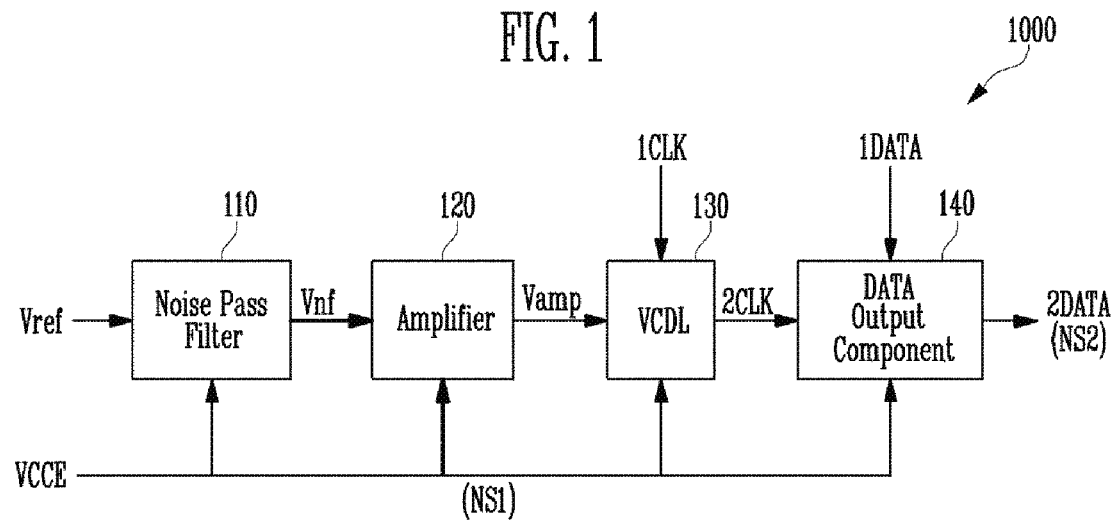
FIG. 1 is a diagram illustrating a general data transfer circuit.

FIG. 1 is a diagram illustrating a general data transfer circuit.

Referring to FIG. 1, a data transfer circuit 1000 may include a plurality of circuits 110 to 140 that operate with an external voltage VCCE. For example, the data transfer circuit 1000 may include the noise pass filter 110, the amplifier 120, the Voltage Controlled Delay Line (VCDL) circuit 130, and the DATA output component 140.

When a fluctuation occurs in the external voltage VCCE, the noise pass filter 110 may detect and output the voltage that fluctuates as a noise. For example, the noise pass filter 110 may compare the external voltage VCCE with a reference voltage Vref and output a voltage difference detected according to a result of comparison as a noise voltage Vnf. The noise pass filter 110 may include a capacitor. The reference voltage Vref may be generated by various methods. For example, the reference voltage Vref may be a bandgap voltage or a voltage generated by a reference voltage generation circuit (not illustrated).

However, in general, because a capacitor has a large size, an area occupied by the noise pass filter 110 may be increased in an area of the data transfer circuit 1000. A circuit of the noise pass filter 110 will be described below with reference to FIG. 3.

The amplifier 120 may operate with the external voltage VCCE and amplify the noise voltage Vnf to output an amplification voltage Vamp. However, because the amplifier 120 operates with the external voltage VCCE that is directly supplied thereto, when noise NS1 occurs in the external voltage VCCE, a level of the amplification voltage Vamp output from the amplifier 120 may become irregular.

The VCDL circuit 130 may operate with the external voltage VCCE, control a frequency or a delay time of a first clock 1CLK according to the amplification voltage Vamp to output a second clock 2CLK. However, because the VCDL circuit 130 also operates with the external voltage VCCE that is directly supplied thereto, when the noise NS1 occurs in the external voltage VCCE, the second clock 2CLK may be irregularly output.

The DATA output component 140 may operate with the external voltage VCCE, receive first data 1DATA and output second data 2DATA in response to the second clock 2CLK. The second data 2DATA may be the amplified first data 1DATA. However, because the DATA output component 140 also operates with the external voltage VCCE that is directly supplied thereto, when the noise NS1 occurs in the external voltage VCCE, jitter may occur in the DATA output component 140; accordingly, noise NS2 may occur in the second data 2DATA.

As described above, because the fluctuation in the external voltage VCCE leads to the noise NS1 during a data transfer operation, the fluctuation in the external voltage VCCE may also generate the noise NS2 to the second data 2DATA that is finally output from the data transfer circuit 1000. Accordingly, the reliability of a device including the data transfer circuit 1000 may be declined.

Figure 2:
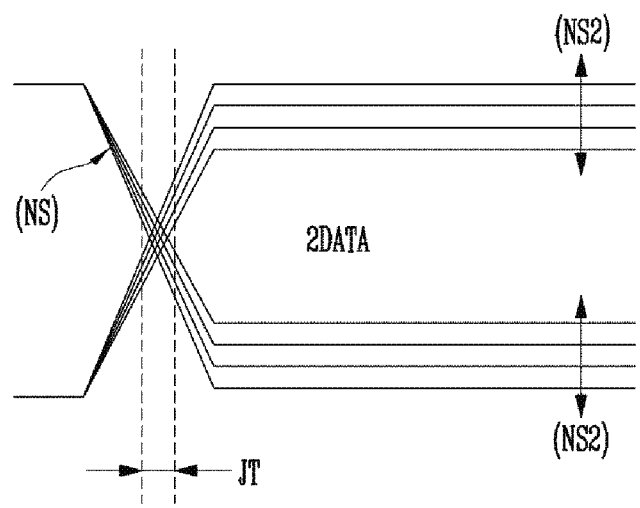
FIG. 2 is a diagram illustrating data jitter caused by a fluctuation in an external voltage.

FIG. 2 is a diagram illustrating data jitter caused by a fluctuation in an external voltage.

Referring to FIG. 2, because the fluctuation in the external voltage VCCE leads to noise NS, jitter JT, that is, variations in a waveform of data may occur. When the jitter JT occurs, variations in an amplitude or a frequency of data arise. Accordingly, the noise NS2 may occur in the second data 2DATA that is finally output.

Figure 3:
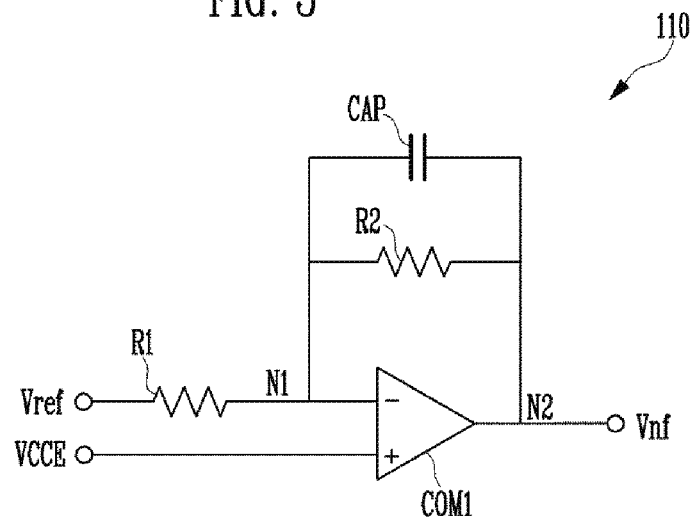
FIG. 3 is a circuit diagram illustrating a noise pass filter shown in FIG. 1.

FIG. 3 is a circuit diagram illustrating the noise pass filter 110 shown in FIG. 1.

Referring to FIG. 3, the noise pass filter 110 may include a first comparator COM1, a plurality of resistors R1 and R2, and a capacitor CAP. For example, the first comparator COM1 may compare the reference voltage Vref with the external voltage VCCE to output the noise voltage Vnf through a second node N2. The first resistor R1 may be coupled between a terminal to which the reference voltage Vref is applied and a first node N1. The reference voltage Vref may be applied to an input terminal − of the first comparator COM1 through the first resistor R1.

The external voltage VCCE may be applied to another input terminal + of the first comparator COM1. The second resistor R2 and the capacitor CAP may be coupled in parallel between the first node N1 and the second node N2. The capacitor CAP may perform a function of charging the reference voltage Vref and stably supplying the reference voltage Vref to the first comparator COM1. Because the first comparator COM1 compares the reference voltage Vref that is stably supplied thereto with the external voltage VCCE and outputs a voltage difference according to a comparison result, the noise voltage Vnf corresponding to noise that occurs in the external voltage VCCE may be output through the second node N2.

However, because the capacitor CAP charging the reference voltage Vref basically includes two electrodes and an insulating layer formed between the electrodes, the capacitor CAP may have a greater size than a general transistor. Accordingly, there are limitations in decreasing the size of the data transfer circuit 1000 due to the noise pass filter 110.

Hereinafter, to mitigate the size of the data transfer circuit 1000 from increasing and mitigate the reliability of data from being declined due to noise of an external voltage, a data transfer circuit 2000 to be shown in FIG. 4 may be configured by employing a regulator instead of the noise pass filter 110.

Figure 4:
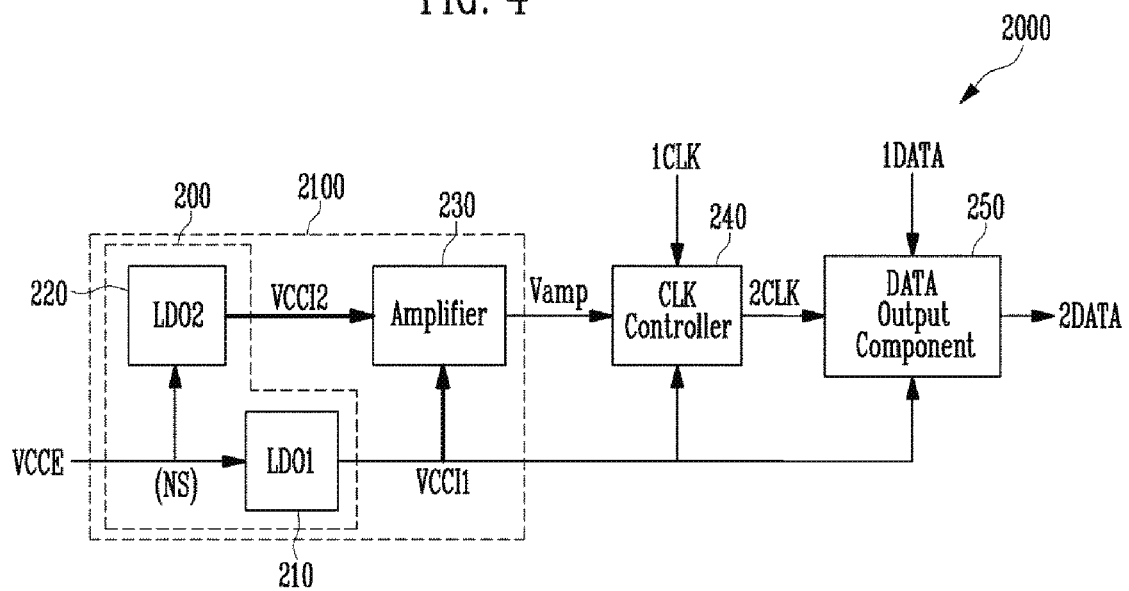
FIG. 4 is a diagram illustrating a noise amplification circuit and a data transfer circuit including the noise amplification circuit according to an embodiment.

FIG. 4 is a diagram illustrating a noise amplification circuit 2100 and the data transfer circuit 2000 including the noise amplification circuit 2100 according to an embodiment.

Referring to FIG. 4, the data transfer circuit 2000 may include the noise amplification circuit 2100, a clock controller 240, and a data output component 250.

The noise amplification circuit 2100 may include an internal power supply circuit 200 and an amplifier 230.

The internal power supply circuit 200 may switch the external voltage VCCE to an internal voltage VCCI and include a plurality of regulators 210 and 220 for the switch. For example, the regulators 210 and 220 may include the first Low-Dropout Regulator (LDO) (LDO1) 210 and the second LDO (LDO2) 220. The LDO may be a DC linear voltage regulator which has a smaller size than other DC-DC regulators and has little switching noise.

According to an embodiment, the internal power supply circuit 200 may include at least two LDOs as stated above.

For example, the LDO1 210 may be provided with the external voltage VCCE and switch the provided external voltage VCCE to a first internal voltage VCCI1 to output. The first internal voltage VCCI1 may be supplied as power of the remaining circuits 230, 240, and 250 except for the LDO2 220 among the circuits of the data transfer circuit 2000.

The LDO2 220 may be provided with the external voltage VCCE the same as the external voltage VCCE provided to the LDO1 210 and output a second internal voltage VCCI2. The LDO2 220 is configured in the same manner as the LDO1 210 and operates with the same external voltage VCCE as the LDO1 210. Thus, the second internal voltage VCCI2 may be the same as the first internal voltage VCCI1. For example, the internal power supply circuit 200 may include a plurality of regulators and the regulators may be provided with the external voltage VCCE in common to output a plurality of internal voltages based on the external voltage.

For example, the LDO1 210 and the LDO2 220 do not include a capacitor, and thus may be configured to have a smaller size than the noise pass filter 110 shown in FIG. 3. In addition, because the LDO1 210 and the LDO2 220 do not output the first and second internal voltages VCCI1 and VCCI2 through a comparator, voltage switching might not occur and the LDO1 210 and the LDO2 220 may have less switching noise than the noise pass filter 110. Accordingly, even when the noise NS occurs in the external voltage VCCE, the first and second internal voltages VCCI1 and VCCI2 may be evenly output without being affected by the noise NS. A configuration of circuits of the LDO1 210 and the LDO2 220 will be described below with reference to FIG. 5.

The amplifier 230 may operate with the first and second internal voltages VCCI1 and VCCI2 and amplify noise between the first internal voltage VCCI1 and the second internal voltage VCCI2 to output the amplification voltage Vamp. For example, when a voltage difference between the first and second internal voltages VCCI1 and VCCI2 occurs, this difference may become noise. The amplifier 230 may amplify the noise to output the amplification voltage Vamp. In addition, because the second internal voltage VCCI2 is evenly supplied by the LDO2 220, the amplifier 230 may also evenly output the amplification voltage Vamp. In an embodiment, the first regulator 210 may output the first internal voltage VCCI1 and this first internal voltage VCCI1 may be used as power for the clock controller 240, the data output component 250, and the amplifier 230.

The clock controller 240 may operate with the first internal voltage VCCI1, control a frequency or a delay of the first clock 1CLK according to the amplification voltage Vamp and output the second clock 2CLK. For example, the clock controller 240 may be embodied into a Voltage Controlled Delay Line (VCDL).

The DATA output component 250 may operate with the first internal voltage VCCI1, receive the first data 1DATA and output the second data 2DATA in response to the second clock 2CLK. The second data 2DATA may be the amplified first data 1DATA.

Because all of the amplifier 230, the clock controller 240, and the DATA output component 250 operate with the first internal voltage VCCI1 in which noise is offset, noise in the DATA output component 250 may also be offset, and thus jitter might not occur. Accordingly, the DATA output component 250 may output the second data 2DATA in which noise is compensated.

Figure 5:
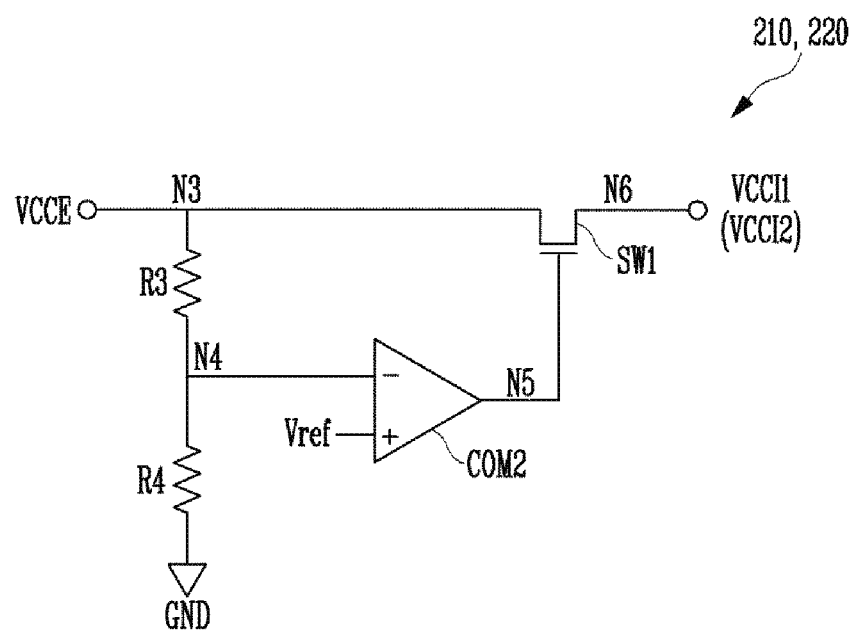
FIG. 5 is a detailed circuit diagram illustrating an LDO according to an embodiment.

FIG. 5 is a detailed circuit diagram illustrating an LDO according to an embodiment. Each of the LDO1 210 and the LDO2 220 may be configured in the same manner as the LDO illustrated in FIG. 5.

Referring to FIG. 5, the LDO may include a second comparator COM2, a plurality of resistors R3 and R4, and a first switch SW1.

The third and fourth resistors R3 and R4 may be coupled to each other in series between a third node N3 to which the external voltage VCCE is applied and a ground terminal GND. A voltage divided by the third and fourth resistors R3 and R4 (i.e., a divided voltage) may be applied to a fourth node N4 between the third and fourth resistors R3 and R4. The divided voltage applied to the fourth node N4 may be applied to an input terminal − of the second comparator COM2 and the reference voltage Vref may be applied to another input terminal + of the second comparator COM2.

The second comparator COM2 may compare the divided voltage with the reference voltage Vref and output a comparison voltage through a fifth node N5.

The first switch SW1 may include an NMOS transistor that is coupled between the third node N3 and a sixth node N6 and operates in response to the comparison voltage applied to the fifth node N5. For example, when the external voltage VCCE increases, the divided voltage of the fourth node N4 may increase, and when the divided voltage increases, the comparison voltage of the fifth node N5 may be decreased by the second comparator COM2. Because a turn-on level of the first switch SW1 is decreased when the comparison voltage is decreased, the first internal voltage VCCI1 or the second internal voltage VCCI2 output through the sixth node N6 may be decreased. Alternatively, the first internal voltage VCCI1 or the second internal voltage VCCI2 output through the sixth node N6 may increase when the turn-on level of the first switch SW1 increases when the external voltage VCCE is decreased. In addition, the first internal voltage VCCI1 or the second internal voltage VCCI2 may be output as a voltage lower than the external voltage VCCE by a threshold voltage of the first switch SW1.

Because each of the LDO1 210 and the LDO2 220 as illustrated in FIG. 4 may be configured in the same manner as the LDO illustrated in FIG. 5, each of the first and second internal voltages VCCI1 and VCCI2 may be output in the same level in both embodiments illustrated in FIGS. 4 and 5. In addition, the circuit illustrated in FIG. 5 is a basic LDO circuit, and thus the LDO circuit may be configured in different manners other than the circuit illustrated in FIG. 5.

Figure 6:
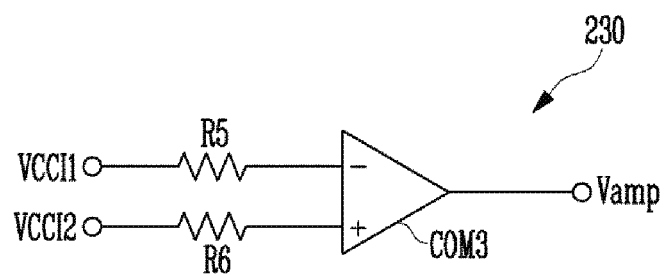
FIG. 6 is a circuit diagram illustrating an amplifier shown in FIG. 4.

FIG. 6 is a circuit diagram illustrating the amplifier 230 shown in FIG. 4.

Referring to FIG. 6, the amplifier 230 may include fifth and sixth resistors R5 and R6 and a third comparator COM3.

The first internal voltage VCCI1 may be applied to an input terminal − of the third comparator COM3 through the fifth resistor R5 and the second internal voltage VCCI2 may be applied to an input terminal + of the third comparator COM3 through the sixth resistor R6.

The third comparator COM3 may compare the first internal voltage VCCI1 with the second internal voltage VCCI2 and amplify a voltage difference between the first internal voltage VCCI1 and the second internal voltage VCCI2 to output the amplification voltage Vamp.

As stated above, because the first internal voltage VCCI1 and the second internal voltage VCCI2 operate in response to the same external voltage VCCE and are output from the LDO1 210 and the LDO2 220 shown in FIG. 4 that are configured the same as each other, respectively, a voltage difference between the first internal voltage VCCI1 and the second internal voltage VCCI2 may be very small.

Accordingly, variations in the amplification voltage Vamp output from the amplifier 230 might not be great, and thus the clock controller 240 shown in FIG. 4 may output the second clock 2CLK which has little difference from the first clock 1CLK and the DATA output component 250 shown in FIG. 4 may output the second data 2DATA without jitter.

The internal power supply circuit 200 may be used in various circuits to mitigate the reliability from being declined despite of the fluctuation in the external voltage VCCE. According to an embodiment, a memory device employing the internal power supply circuit 200 as stated above will be described as below.

Figure 7:
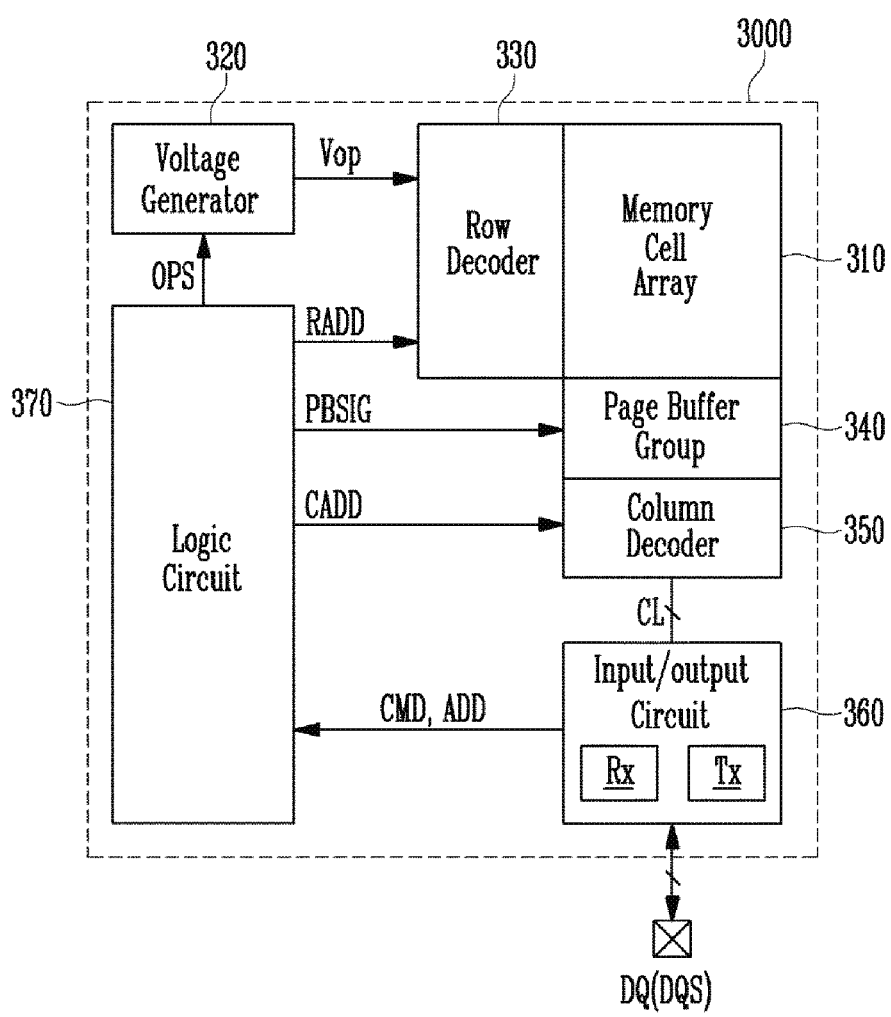
FIG. 7 is a diagram illustrating a memory device.

FIG. 7 is a diagram illustrating a memory device 3000.

Referring to FIG. 7, the memory device 3000 may include a memory cell array 310 storing data, peripheral circuits 320, 330, 340, 350, and 360 performing program, read and erase operations, and a logic circuit 370 controlling the peripheral circuits 320, 330, 340, 350, and 360.

The memory cell array 310 may include volatile memory cells or non-volatile memory cells.

The peripheral circuits 320, 330, 340, 350, and 360 may include the voltage generator 320, the row decoder 330, the page buffer group 340, the column decoder 350, and the input/output circuit 360.

The voltage generator 320 may generate operating voltages Vop used for various operations in response to an operating signal OPS.

The row decoder 330 may select memory blocks included in the memory cell array 310 or at least one word line in response to a row address RADD.

The page buffer group 340 may temporarily store and transfer data during the program operation or the read operation in response to a page buffer signal PBSIG.

The column decoder 350 may transfer data between column lines CL and the page buffer group 340 in response to a column address CADD.

The input/output circuit 360 may transfer a command CMD and an address ADD received through data pads DQ to the logic circuit 370 and transfer data received through the data pads DQ to the column lines CL. Alternatively, the input/output circuit 360 may output data, which is received through the column lines CL, through the data pads DQ. In addition, the input/output circuit 360 may transfer a data strobe clock to an external device and receive the data strobe clock from the external device through data strobe pads DQS. The external device may be a controller controlling the memory device 3000.

The input/output circuit 360 may include an input circuit Rx and an output circuit Tx for input/output of a command, an address, or data. The input circuit Rx may be used when receiving a command, an address, and data from an external device. The output circuit Tx may be used when outputting data read from the memory cell array 310 to an external device.

Because the input circuit Rx and the output circuit Tx should transfer data without an error, jitter may be a factor to decline the reliability of the memory device 3000, when the jitter may occur. Accordingly, to mitigate jitter due to variations in the external voltage VCCE from occurring, each of the input circuit Rx and the output circuit Tx may include the internal power supply circuit 200 shown in FIG. 4.

In this regard, the input circuit Rx including the internal power supply circuit 200 will be described as an embodiment as below.

Figure 8:
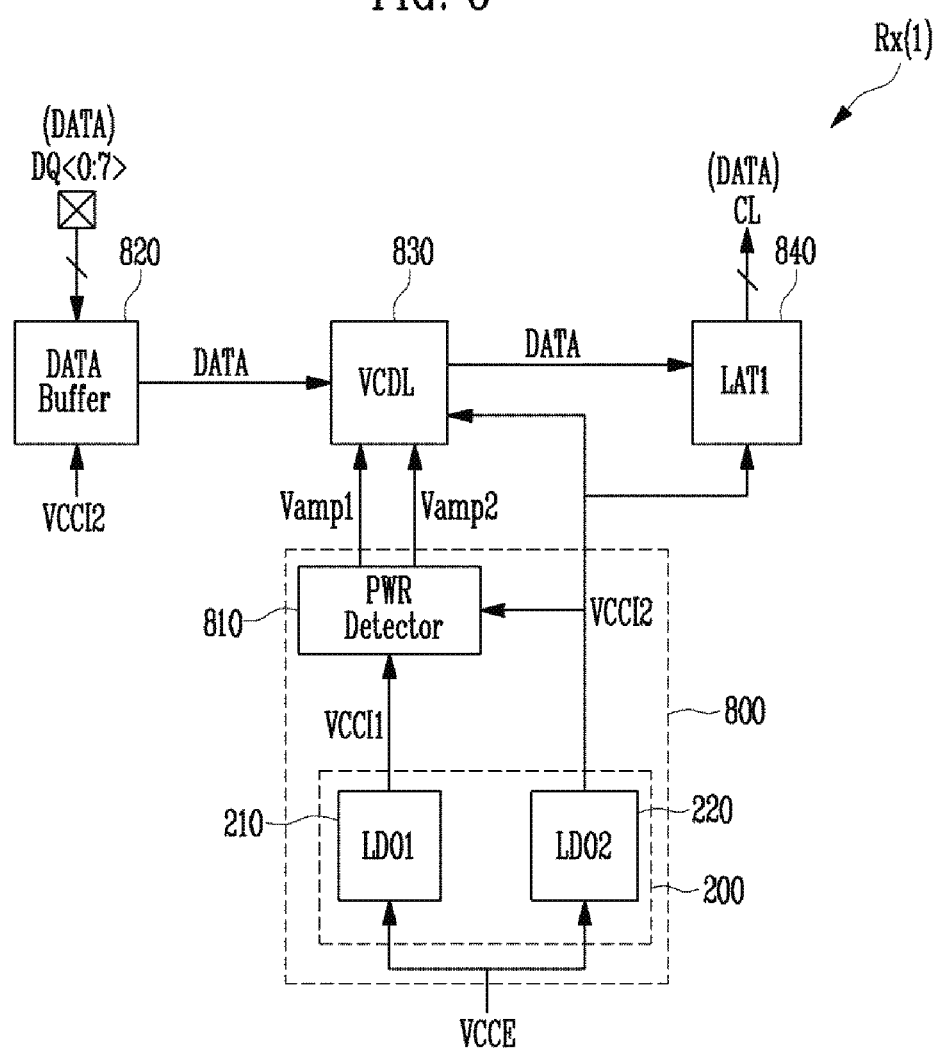
FIG. 8 is a diagram illustrating a first embodiment of an input circuit shown in FIG. 7.

FIG. 8 is a diagram illustrating a first embodiment of the input circuit Rx shown in FIG. 7.

Referring to FIG. 8, an input circuit Rx(1) according to the first embodiment may include a noise amplification circuit 800, a data buffer 820, a VCDL circuit 830, and a first latch LAT1 (840).

The noise amplification circuit 800 may include the internal power supply circuit 200 and a power (PWR) detector 810.

The internal power supply circuit 200 may be provided with the external voltage VCCE and generate the first internal voltage VCCI1 and the second internal voltage VCCI2. The first internal voltage VCCI1 and the second internal voltage VCCI2 may be supplied as power of the remaining circuits 810, 820, 830, and 840 except for the internal power supply circuit 200.

The PWR detector 810 may amplify a voltage difference between the first internal voltage VCCI1 and the second internal voltage VCCI2 to output first and second amplification voltages Vamp1 and Vamp2.

The data buffer 820 may operate with the second internal voltage VCCI2 and transfer data DATA received through the data pads DQ to the VCDL circuit 830. For example, when a width of the data DATA is 8 bits, the data pads DQ may include eight data pads DQ0 to DQ7 DQ<0:7>.

The VCDL circuit 830 may operate with the second internal voltage VCCI2, control a delay time of the data DATA received from the data buffer 820 according to the first and second amplification voltages Vamp1 and Vamp2 to output to the first latch LAT1.

The first latch LAT1 may operate with the second internal voltage VCCI2 and output the data DATA received from the VCDL circuit 830 through the column lines CL. The data DATA loaded into the column lines CL may be transferred to the column decoder 350 shown in FIG. 7.

Because the input circuit Rx(1) according to the first embodiment supplies power to internal circuits by using the internal power supply circuit 200, and the PWR detector 810 compares the first internal voltage VCCI1 with the second internal voltage VCCI2 similar to each other and outputs the first and second amplification voltages Vamp1 and Vamp2, jitter may be mitigated from occurring while the data DATA is transferred to the column lines CL through the data pads DQ, the data buffer 820, the VCDL circuit 830 and the first latch LAT1. Accordingly, the reliability of the data DATA transferred to the column lines CL may be improved.

Figure 9:
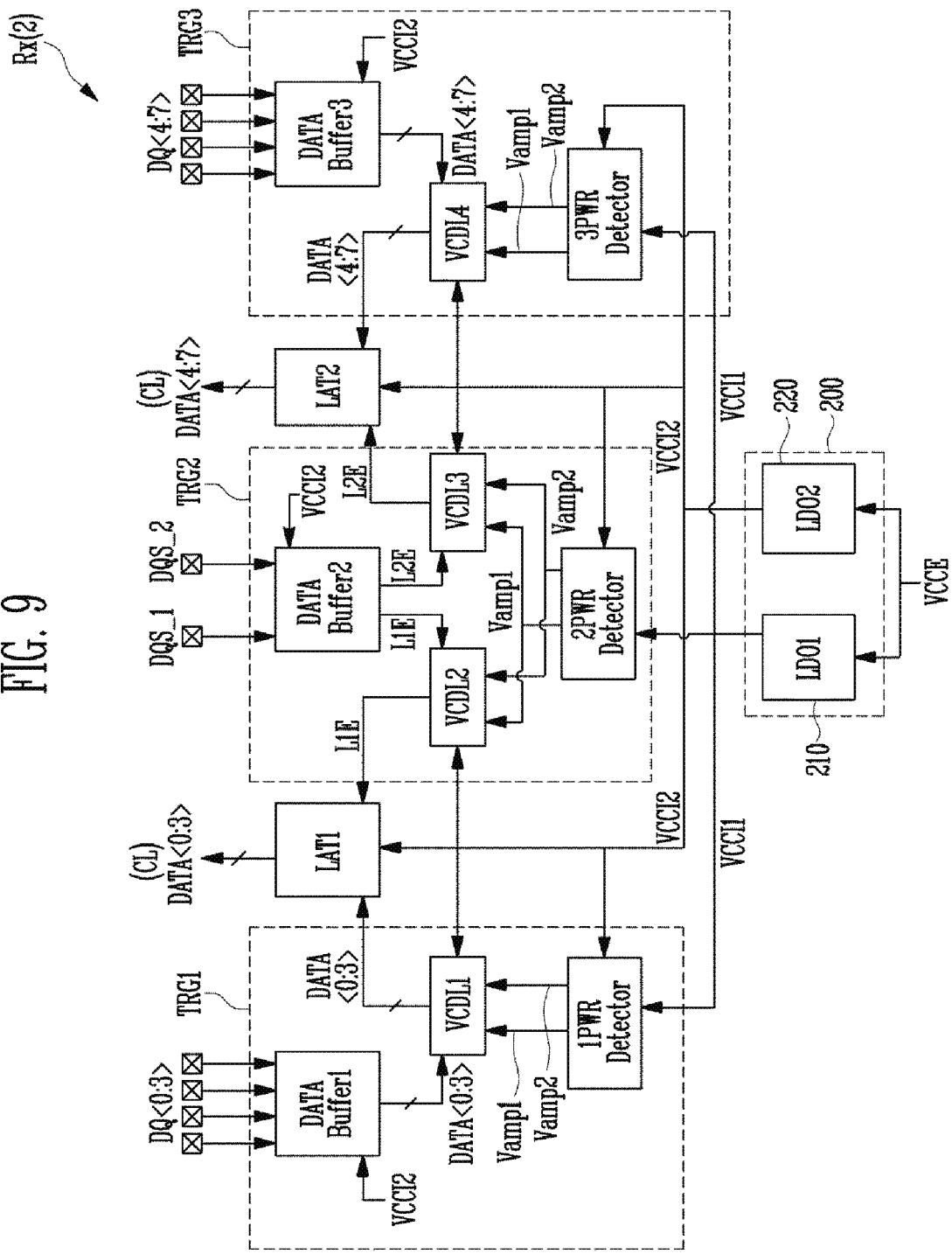
FIG. 9 is a diagram illustrating a second embodiment of an input circuit shown in FIG. 7.

FIG. 9 is a diagram illustrating a second embodiment of the input circuit Rx shown in FIG. 7.

An input circuit Rx(2) according to the second embodiment different from the first embodiment will be illustrated in FIG. 9.

The input circuit Rx(2) according to the second embodiment may receive data or a data strobe clock through a plurality of data pads DQ0 to DQ3 DQ<0:3> and DQ4 to DQ7 DQ<4:7> and data strobe pads DQS_1 and DQS_2. Circuits included in the input circuit Rx(2) may be classified into a plurality of transfer groups TRG1, TRG2, and TRG3 according to the data pads DQ0 to DQ3 DQ<0:3> and DQ4 to DQ7 DQ<4:7> and the data strobe pads DQS_1 and DQS_2. Circuits included in each of the transfer groups TRG1, TRG2, and TRG3 may operate with the second internal voltage VCCI2 generated from the internal power supply circuit 200 in common. For example, the first transfer group TRG1 may include circuits transferring data that is input through the data pads DQ0 to DQ3 DQ<0:3>, the second transfer group TRG2 may include circuits transferring data strobe clocks that are input through the data strobe pads DQS_1 and DQS_2, and the third transfer group TRG3 may include circuits transferring data that is input through the data pads DQ4 to DQ7 DQ<4:7>.

Data DATA0 to DATA3 DATA<0:3> transferred from the first transfer group TRG1 may be output to the column lines CL through the first latch LAT1 and data DATA4 to DATA7 DATA<4:7> transferred from the third transfer group TRG3 may be output to the column lines CL through a second latch LAT2. The data strobe clocks transferred from the second transfer group TRG2 may be output to the first latch LAT1 or the second latch LAT2, and the first latch LAT1 or the second latch LAT2 may output the data DATA0 to DATA3 DATA<0:3> or the data DATA4 to DATA7 DATA<4:7> to the column lines CL in response to the data strobe clocks alternately output from the second transfer group TRG2.

The internal power supply circuit 200 may include the first LDO (LDO1) 210 and the second LDO (LDO2) 220. The LDO1 210 may generate the first internal voltage VCCI1 in response to the external voltage VCCE and the LDO2 220 may generate the second internal voltage VCCI2 in response to the external voltage VCCE. The LDO1 210 and the LDO2 220 are the same as the circuit as described above with reference to FIG. 5, therefore detailed explanation thereof will be omitted.

The first internal voltage VCCI1 may be applied to each of first, second, and third power (PWR) detectors 1PWR Detector, 2PWR Detector, and 3PWR Detector included in the first, second, and third transfer groups TRG1, TRG2, and TRG3, respectively. The second internal voltage VCCI2 may be supplied to the first, second, and third transfer groups TRG1, TRG2, and TRG3, the first latch LAT1, and the second latch LAT2, in common.

The first transfer group TRG1 may include the first power detector 1PWR Detector, a first VCDL circuit VCDL1 and a first data buffer DATA Buffer1. The first power detector 1PWR Detector may compare the first internal voltage VCCI1 with the second internal voltage VCCI2, and amplify a voltage difference between the first internal voltage VCCI1 and the second internal voltage VCCI2 to output the first and second amplification voltages Vamp1 and Vamp2. The first data buffer DATA Buffer1 may operate with the second internal voltage VCCI2 and transfer data DATA0 to DATA3 DATA<0:3> that is received from the data pads DQ0 to DQ3 DQ<0:3> to the first VCDL circuit VCDL1. The first VCDL circuit VCDL1 may operate with the second internal voltage VCCI2 and transfer the data DATA0 to DATA3 DATA<0:3> that is received from the first data buffer DATA Buffer1 to the first latch LAT1 in response to the first and second amplification voltages Vamp1 and Vamp2.

The second transfer group TRG2 may include the second power detector 2PWR Detector, second and third VCDL circuits VCDL2 and VCDL3, and a second data buffer DATA Buffer2. The second power detector 2PWR Detector may compare the first internal voltage VCCI1 with the second internal voltage VCCI2 and amplify a voltage difference between the first internal voltage VCCI1 and the second internal voltage VCCI2 to output the first and second amplification voltages Vamp1 and Vamp2. The second data buffer DATA Buffer2 may operate with the second internal voltage VCCI2, transfer a first data strobe clock L1E that is received from the first data strobe pad DQS_1 to the second VCDL circuit VCDL2, and transfer a second data strobe clock L2E that is received from the second data strobe pad DQS_2 to the third VCDL circuit VCDL3. The second and third data strobe clocks may have levels opposite to each other.

The second VCDL circuit VCDL2 may operate with the second internal voltage VCCI2 and transfer the first data strobe clock L1E that is received from the second data buffer DATA Buffer2 to the first latch LAT1 in response to the first and second amplification voltages Vamp1 and Vamp2.

The third VCDL circuit VCDL3 may operate with the second internal voltage VCCI2 and transfer the second data strobe clock L2E that is received from the second data buffer DATA Buffer2 to the second latch LAT2 in response to the first and second amplification voltages Vamp1 and Vamp2.

The first latch LAT1 may transfer the data DATA0 to DATA3 DATA<0:3> to the column lines CL in response to the first data strobe clock L1E. For example, the first latch LAT1 may transfer the data DATA0 to DATA3 DATA<0:3> to the column lines CL every time the first data strobe clock L1E has a high level.

The second latch LAT2 may transfer the data DATA4 to DATA7 DATA<4:7> to the column lines CL in response to the second data strobe clock L2E. For example, the second latch LAT2 may transfer the data DATA4 to DATA7 DATA<4:7> to the column lines CL every time the second data strobe clock L2E has a high level.

The third transfer group TRG3 may include the third power detector 3PWR Detector, a fourth VCDL circuit VCDL4, and a third data buffer DATA Buffer3. The third power detector 3PWR Detector may compare the first internal voltage VCCI1 with the second internal voltage VCCI2 and amplify a voltage difference between the first internal voltage VCCI1 and the second internal voltage VCCI2 to output the first and second amplification voltages Vamp1 and Vamp2. The third data buffer DATA Buffer3 may operate with the second internal voltage VCCI2 and transfer the data DATA4 to DATA7 DATA<4:7> that is received from the data pads DQ4 to DQ7 DQ<4:7> to the fourth VCDL circuit VCDL4. The fourth VCDL circuit VCDL4 may operate with the second internal voltage VCCI2 and transfer the data DATA4 to DATA7 DATA<4:7> that is received from the third data buffer DATA Buffer3 to the second latch LAT2 in response to the first and second amplification voltages Vamp1 and Vamp2.

4-bit data may be transferred in response to one data strobe clock in the input circuit Rx(2) illustrated in FIG. 9. However, the number of bits of data and data strobe clocks are not limited thereto.

The input circuit Rx(2) illustrated in FIG. 9 may be divided into the first, second, and third transfer groups TRG1, TRG2, and TRG3 according to the data pads DQ0 to DQ3 DQ<0:3> and DQ4 to DQ7 DQ<4:7> and the data strobe pads DQS_1 and DQS_2, and each of the first, second, and third transfer groups TRG1, TRG2, and TRG3 may generate the first and second amplification voltages Vamp1 and Vamp2 in response to the first and second internal voltages VCCI1 and VCCI2 that are generated from the internal power supply circuit 200 and operate. Accordingly, jitter may be mitigated from occurring in the input circuit Rx(2) as described above compared to a general input circuit in which a plurality of circuits share amplification voltages during a data transfer operation.

A circuit of each of the power detector PWR Detector shown in FIG. 8 and the first, second, and third power detectors 1PWR Detector, 2PWR Detector, and 3PWR Detector shown in FIG. 9 will be described in detail with reference to FIG. 10. A circuit of the VCDL circuit will be described in detail with reference to FIG. 11.

Figure 10:
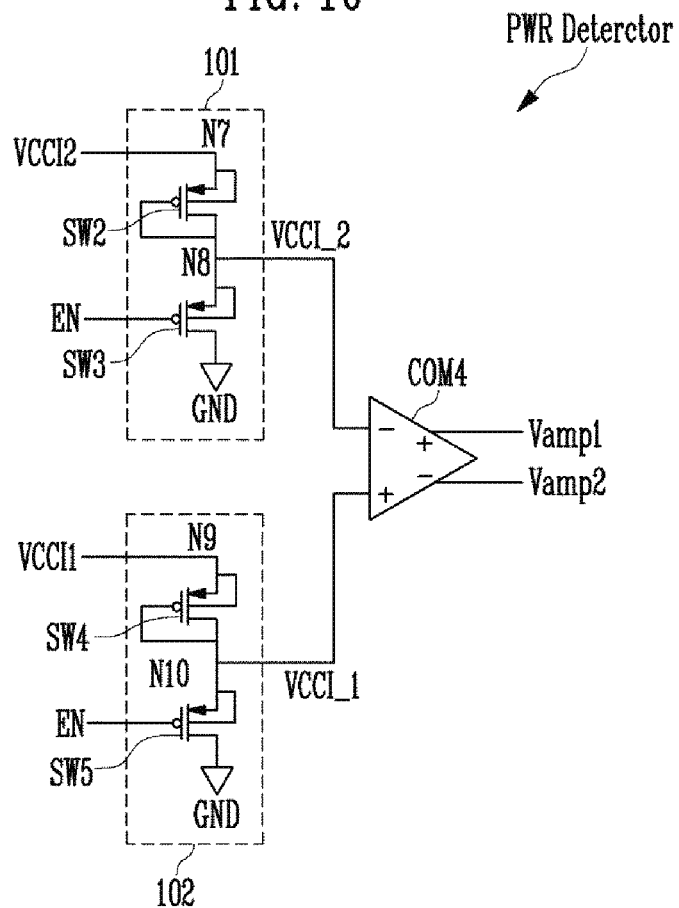
FIG. 10 is a circuit diagram illustrating a power detector included in an input circuit.

FIG. 10 is a detailed circuit diagram illustrating a power detector included in an input circuit.

Referring to FIG. 10, the power detector PWR Detector may include a first detection circuit 101, a second detection circuit 102, and a fourth comparator COM4.

The first detection circuit 101 may output a second sub-internal voltage VCCI_2 in response to the second internal voltage VCCI2 and an enable signal EN. The first detection circuit 101 may include a second switch SW2 and a third switch SW3. The second switch SW2 may include a PMOS transistor which is coupled between a seventh node N7 and an eighth node N8 and transfers the second internal voltage VCCI2 to the eighth node N8 in response to a voltage of the eighth node N8. The third switch SW3 may include a PMOS transistor which is coupled between the eighth node N8 and the ground terminal GND and couples the eighth node N8 and the ground terminal GND together in response to the enable signal EN. The enable signal EN may be output from the logic circuit 370 shown in FIG. 7 and may be internally generated in the input/output circuit 360 shown in FIG. 7 according to an embodiment. Because a turn-on level of the third switch SW3 is adjusted according to a level of the enable signal EN, a voltage of the eighth node N8 may also be adjusted. In addition, a turn-on level of the second switch SW2 is adjusted according to a voltage of the eighth node N8. Accordingly, the voltage of the eighth node N8 may be adjusted in response to the level of the enable signal EN and the second internal voltage VCCI2. Because the enable signal EN has a predetermined voltage, the voltage of the eighth node N8 may be adjusted in response to the second internal voltage VCCI2 according to this embodiment. Accordingly, the second sub-internal voltage VCCI_2 may be adjusted.

The second detection circuit 102 may output a first sub-internal voltage VCCI_1 in response to the first internal voltage VCCI1 and the enable signal EN. The second detection circuit 102 may include a fourth switch SW4 and a fifth switch SW5. The fourth switch SW4 may include a PMOS transistor which is coupled between a ninth node N9 and a tenth node N10 and transfers the first internal voltage VCCI1 to the tenth node N10 according to a voltage of the tenth node N10. The fifth switch SW5 may include a PMOS transistor which is coupled between the tenth node N10 and the ground terminal GND and couples the tenth node N10 and the ground terminal GND together in response to the enable signal EN. The enable signal EN may be the same as the enable signal applied to the first detection circuit 101. Because a turn-on level of the fifth switch SW5 is adjusted according to a level of the enable signal EN, a voltage of the tenth node N10 may also be adjusted. In addition, a turn-on level of the fourth switch SW4 is adjusted according to a voltage of the tenth node N10. Accordingly, the voltage of the tenth node N10 may be adjusted in response to the level of the enable signal EN and the first internal voltage VCCI1. Because the enable signal EN has a predetermined voltage, the voltage of the tenth node N10 may be adjusted in response to the first internal voltage VCCI1 according to this embodiment. Accordingly, the first sub-internal voltage VCCI_1 may be adjusted.

The fourth comparator COM4 may compare the first sub-internal voltage VCCI_1 with the second sub-internal voltage VCCI_2 to output a voltage difference between the first sub-internal voltage VCCI_1 and the second sub-internal voltage VCCI_2 as the first amplification voltage Vamp1, and output the second amplification voltage Vamp2, which has an opposite level to the first amplification voltage Vamp1, at the same time as the first amplification voltage Vamp1.

Figure 11:
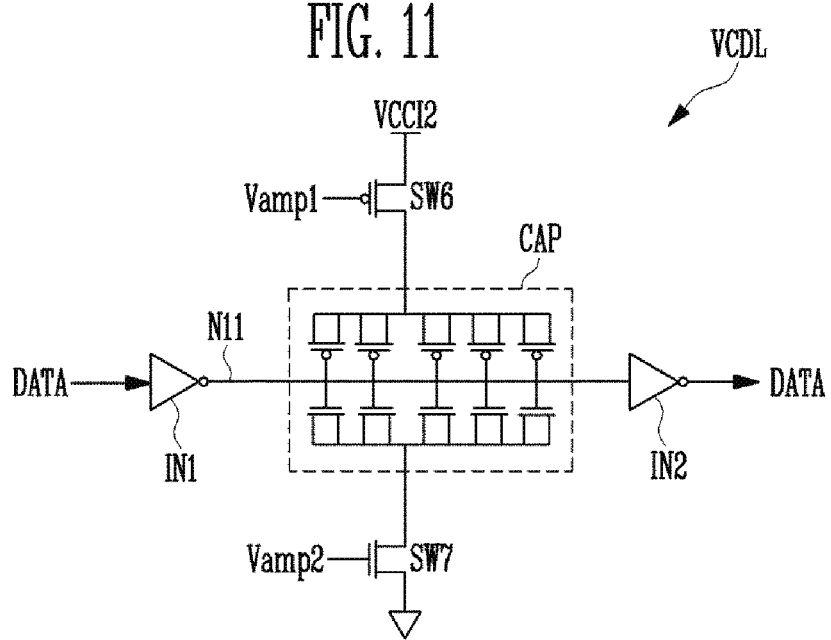
FIG. 11 is a circuit diagram illustrating a VCDL circuit included in an input circuit.

FIG. 11 is a circuit diagram illustrating a VCDL circuit included in an input circuit.

Referring to FIG. 11, the VCDL circuit may operate with the second internal voltage VCCI2, delay and output the received data DATA. The VCDL circuit according to this embodiment may include the capacitor CAP.

The capacitor CAP may be coupled between a first inverter IN1 inverting the received data DATA and a second inverter IN2 inverting the data that is transferred from the first inverter IN1 to output. The capacitor CAP may include two electrodes. One electrode may include PMOS transistors and the other electrode may include NMOS transistors. Bulk of the PMOS transistors included in the electrodes of the capacitor CAP may be coupled to a sixth switch SW6 in common. The sixth switch SW6 may include a PMOS transistor which transfers the second internal voltage VCCI2 to the bulk of the PMOS transistors in response to the first amplification voltage Vamp1. Bulk of the NMOS transistors included in the electrodes of the capacitor CAP may be coupled to a seventh switch SW7 in common. The seventh switch SW7 may include an NMOS transistor which couples the bulk of the NMOS transistors to the ground terminal GND in response to the second amplification voltage Vamp2.

Because the VCDL circuit provides a predetermined delay to the received data and outputs the delayed data, a circuit may be embodied in various structures other than the circuit as illustrated in FIG. 11.

Figure 12:
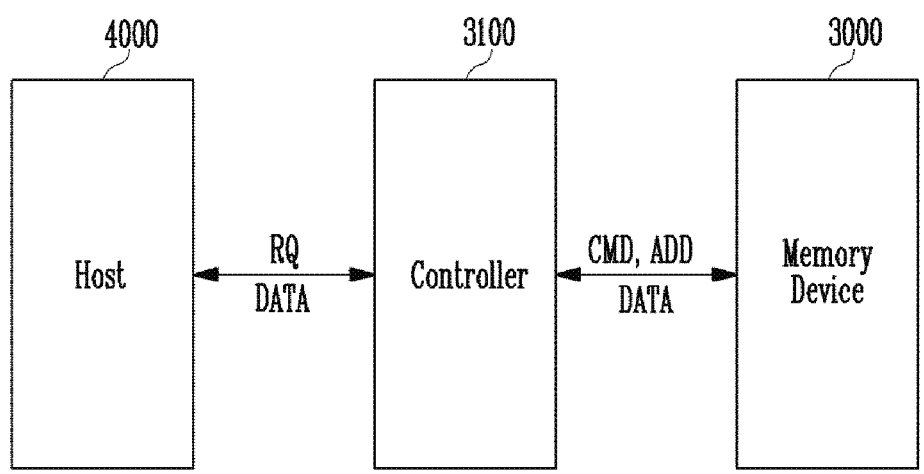
FIG. 12 is a diagram illustrating a memory system.

FIG. 12 is a diagram illustrating a memory system.

Referring to FIG. 12, the memory device 3000 may be included in a memory system including a controller 3100 and a host 4000.

For example, the host 4000 may transfer a request RQ such as a program request, a read request, or an erase request to the controller 3100, transfer data to the controller 3100 during the program operation, and receive the read data during the read operation.

The controller 3100 may generate the command CMD in response to the request RQ received from the host 4000, transfer the generated command CMD or the address ADD to the memory device 3000, or output the data DATA read from the memory device 3000 to the host 4000.

The internal power supply circuits 200 shown in FIG. 4 may be used not only in the memory device 3000, but also in the controller 3100 or the host 4000.

As described above, according to the present disclosure, an internal voltage may be stably supplied and jitter may be removed when data is transferred.

Examples of embodiments have been disclosed herein, and although specific terms are employed, various changes in forms and details may be made to the above-described examples of embodiments without departing from the spirit and scope of the present disclosure. Accordingly, it will be understood by those skilled in the art that the scope of the present disclosure should not be limited to the above-described examples of embodiments, and may cover the scope of the following claims and their equivalents.

What is claimed is:

1. A noise amplification circuit, comprising:
    a first regulator provided with an external voltage to output a first internal voltage;
    a second regulator configured in a same manner as the first regulator and provided with the external voltage to output a second internal voltage;
    an amplifier configured for amplifying noise between the first internal voltage and the second internal voltage to output an amplification voltage; and
    a plurality of peripheral circuits performing by being provided with the first internal voltage.

2. The noise amplification circuit of claim 1, wherein the first internal voltage output from the first regulator is output from the noise amplification circuit and received by the amplifier to output the amplification voltage, and
    wherein the second internal voltage output from the second regulator is received by the amplifier.

3. The noise amplification circuit of claim 1, wherein the first regulator comprises a Low-Dropout Regulator (LDO).

4. The noise amplification circuit of claim 3, wherein the LDO includes a first switch configured to receive the external voltage and output the first internal voltage to the amplifier.

5. The noise amplification circuit of claim 4, wherein the first switch includes a transistor turned on or turned off in response to a comparison voltage based on a reference voltage and a divided voltage of the external voltage.

6. The noise amplification circuit of claim 3, wherein the LDO comprises:
    first and second resistors dividing the external voltage to output a divided voltage;
    a first comparator comparing the divided voltage with a reference voltage to output a comparison voltage; and
    a first switch outputting a voltage lower than the external voltage by a threshold voltage as the first internal voltage in response to the comparison voltage.

7. The noise amplification circuit of claim 6, wherein a node coupling the first resistor and the second resistor together is coupled to a first input terminal of the first comparator, and
    wherein the reference voltage is applied to another input terminal of the first comparator.

8. The noise amplification circuit of claim 6, wherein the first switch includes an NMOS transistor turned on or turned off in response to the comparison voltage.

9. The noise amplification circuit of claim 1, wherein the amplifier comprises a second comparator amplifying a voltage difference between the first internal voltage and the second internal voltage to output the amplification voltage.

10. A memory device, comprising:
a memory cell array configured to store data;
peripheral circuits configured to program data to the memory cell array, read stored data, or erase stored data; and
a logic circuit configured for controlling the peripheral circuits,
wherein the peripheral circuits comprise an input circuit, switching an external voltage to first and second internal voltages, amplifying noise between the first and second internal voltages to output an amplification voltage and receiving data through data pads using the first and second internal voltages.

11. The memory device of claim 10, wherein the peripheral circuits comprise:
a voltage generator generating operating voltages used for various operations in response to an operating signal;
a row decoder selecting at least one word line in response to a row address;
a page buffer group temporarily storing and transferring program data or read data in response to a page buffer signal;
a column decoder transferring data between column lines and the page buffer group in response to a column address; and
an input/output circuit including the input circuit, wherein the input/output circuit transfers and receives the data through the data pads, or receives a command and an address from a controller and transfer the command and the address to the logic circuit.

12. The memory device of claim 11, wherein the input circuit comprises:
an internal power supply circuit including a plurality of regulators configured to receive the external voltage in common and the internal power supply circuit configured to output the first internal voltage and the second internal voltage based on the external voltage;
a power detector amplifying the noise between the first internal voltage and the second internal voltage to output first and second amplification voltages;
a data buffer operating with the second internal voltage and receiving the data through the data pads;
a Voltage Controlled Delay Line (VCDL) circuit operating with the second internal voltage and controlling a delay time of data that is output from the data buffer to output the data in response to the first and second amplification voltages; and
a latch operating with the second internal voltage and outputting data that is received from the VCDL circuit through the column lines.

13. The memory device of claim 12, wherein the internal power supply circuit comprises:
a first regulator provided with the external voltage to output the first internal voltage; and
a second regulator configured in a same manner as the first regulator and provided with the external voltage to output the second internal voltage.

14. The memory device of claim 12, wherein the first and second amplification voltages are output as voltages having levels opposite to each other.

15. The memory device of claim 11, wherein the input circuit comprises:
an internal power supply circuit including a plurality of regulators configured to receive the external voltage in common and the internal power supply circuit configured to output the first internal voltage and the second internal voltage based on the external voltage;
a first transfer group receiving data from first data pads among the data pads and outputting the data to a first latch;
a second transfer group receiving data from second data pads among the data pads and outputting the data to a second latch; and
a third transfer group receiving data strobe clocks from data strobe pads and transferring each of the data strobe clocks to the first latch or the second latch.

16. The memory device of claim 15, wherein the internal power supply circuit comprises:
a first Low-Dropout Regulator (LDO) provided with the external voltage to output the first internal voltage; and
a second LDO configured in a same manner as the first LDO and provided with the external voltage to output the second internal voltage.

17. The memory device of claim 15, wherein the first transfer group comprises:
a power detector amplifying a voltage difference between the first internal voltage and the second internal voltage to output first and second amplification voltages;
a data buffer operating with the second internal voltage and outputting data that is received from the first data pads; and
a Voltage Controlled Delay Line (VCDL) circuit operating with the second internal voltage, controlling a delay time of data that is received from the data buffer to output the data to the first latch in response to the first and second amplification voltages.

18. The memory device of claim 15, wherein the second transfer group comprises:
a power detector amplifying a voltage difference between the first internal voltage and the second internal voltage to output first and second amplification voltages;
a data buffer operating with the second internal voltage and outputting data that is received from the second data pads; and
a VCDL circuit operating with the second internal voltage, controlling a delay time of data that is received from the data buffer, and outputting the data to the second latch in response to the first and second amplification voltages.

19. The memory device of claim 15, wherein the third transfer group comprises:
a power detector amplifying a voltage difference between the first internal voltage and the second internal voltage to output first and second amplification voltages;
a data buffer receiving and outputting first and second data strobe clocks that are applied to the data strobe pads;
a first VCDL circuit operating with the second internal voltage and transferring the first data strobe clock to the first latch in response to the first and second amplification voltages; and
a second VCDL circuit operating with the second internal voltage and transferring the second data strobe clock to the second latch in response to the first and second amplification voltages.

20. The memory device of claim 19, wherein the second data strobe clock has a level opposite to a level of the first data strobe clock.

* * * * *